US009516248B2

(12) United States Patent
Cohen et al.

(10) Patent No.: US 9,516,248 B2
(45) Date of Patent: Dec. 6, 2016

(54) PHOTOSENSOR HAVING ENHANCED SENSITIVITY

(71) Applicant: Microsoft Technology Licensing, LLC, Redmond, WA (US)

(72) Inventors: David Cohen, Nesher (IL); Shlomo Felzenshtein, Nesher (IL); Eli Larry, Beit Shean (IL); Giora Yahav, Haifa (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 456 days.

(21) Appl. No.: 13/832,400

(22) Filed: Mar. 15, 2013

(65) Prior Publication Data

US 2014/0267613 A1    Sep. 18, 2014

(51) Int. Cl.
| | |
|---|---|
| *H04N 13/02* | (2006.01) |
| *H04N 5/378* | (2011.01) |
| *G01S 17/89* | (2006.01) |
| *H01L 27/148* | (2006.01) |
| *H04N 5/355* | (2011.01) |
| *H04N 5/372* | (2011.01) |
| *H04N 5/3728* | (2011.01) |
| *G01S 7/486* | (2006.01) |
| *H01L 27/146* | (2006.01) |

(52) U.S. Cl.
CPC ............ *H04N 5/378* (2013.01); *G01S 7/4863* (2013.01); *G01S 17/89* (2013.01); *H01L 27/14609* (2013.01); *H01L 27/14843* (2013.01); *H04N 5/3559* (2013.01); *H04N 5/3728* (2013.01); *H04N 5/37206* (2013.01)

(58) Field of Classification Search
USPC ........................................................... 348/46
See application file for complete search history.

(56) References Cited

U.S. PATENT DOCUMENTS

| | | | |
|---|---|---|---|
| 5,703,642 A | 12/1997 | Stevens | |
| 5,814,854 A * | 9/1998 | Liu et al. | ....................... 257/315 |
| 6,225,670 B1 * | 5/2001 | Dierickx | ....................... 257/431 |
| 7,858,914 B2 | 12/2010 | Li et al. | |
| 8,021,908 B2 | 9/2011 | Ladd | |
| 2001/0042817 A1 | 11/2001 | Harada | |
| 2011/0187826 A1 | 8/2011 | Felzenshtein et al. | |
| 2012/0075427 A1 | 3/2012 | Yahav et al. | |
| 2012/0105823 A1 | 5/2012 | Hardegger et al. | |
| 2012/0132788 A1 | 5/2012 | Findlay | |
| 2012/0154535 A1 | 6/2012 | Yahav et al. | |

(Continued)

OTHER PUBLICATIONS

"International Search Report & Written Opinion for PCT Application No. PCT/US2014/023839", Mailed Date: Jul. 24, 2014, Filed Date: Mar. 12, 2014, 11 Pages.

(Continued)

*Primary Examiner* — Tracy Y Li
(74) *Attorney, Agent, or Firm* — Gregg Wisdom; Judy Yee; Micky Minhas

(57) ABSTRACT

A method of controlling a photosensor having adjacent light sensitive pixels in which photocharge is generated in depletion zones of the pixels by light incident on the photosensor, comprising applying voltage to gate electrodes of the photopixels so that the depletion zone of one of the pixels extends into and lies under a portion of the depletion region of the other pixel.

16 Claims, 4 Drawing Sheets

(56) References Cited

U.S. PATENT DOCUMENTS

2012/0181581 A1* 7/2012 Hynecek ............... 257/222

OTHER PUBLICATIONS

Niclass, et al., "A CMOS 3D Camera with Millimetric Depth Resolution", In Proceedings of the IEEE Custom Integrated Circuits Conference, Oct. 3, 2004, 4 pages.
"International Preliminary Report on Patentability for PCT Application No. PCT/US2014/023839", Mailed Date: Jun. 12, 2015; Filed Date: Mar. 12, 2014, 10 Pages.

* cited by examiner

PHOTOSENSOR HAVING ENHANCED SENSITIVITY

TECHNICAL FIELD

Embodiments of the invention relate to photosensors and methods of operating photosensors.

BACKGROUND

A camera typically comprises a photosensor, such as a CCD (charge coupled device) or CMOS (complimentary metal on silicon) photosensor, on which light from a scene imaged by the camera is focused by the camera's optics during an exposure period of the camera to acquire an image of the scene. The photosensor comprises a plurality of light sensitive pixels that are generally configured in an array of rows and columns of pixels. A pixel in the photosensor collects and registers light incident from a region of the scene imaged on the pixel by the camera optics by accumulating positive or negative electric charge provided by electron-hole pairs generated by the incident light.

The electron-hole pairs are generated in a depletion zone of a photodiode region of the pixel. A portion of a pixel occupied by its photodiode region hereinafter also referred to as a photodiode is referred to as a fill factor of the pixel. Generally, pixel sensitivity to incident light increases as its fill factor increases. To prevent cross talk between adjacent pixels during an exposure period, photodiode regions of adjacent pixels are separated by relatively deep barrier regions, referred to as channel stops, that prevent photocharge generated in one photodiode region from migrating to the photodiode or storage region of the adjacent pixel.

Which of electrons or holes are accumulated by the photosensor to accumulate photocharge that measures incident light depends on the doping structure of the photosensor. Charge provided by electron hole pairs generated by incident light may be referred to as photocharge. Electrons originating from electron hole pairs may be referred to as photoelectrons.

Photocharge generated in the photodiode region of a pixel during the exposure period is typically, temporarily stored in the pixel's photodiode region, and towards the end of the exposure period is transferred to a photocharge storage region of the pixel underlying, generally, a plurality of "gate" electrodes. Photocharge transferred to the storage region of each pixel is transferred to a read out amplifier that generates a voltage responsive to the amount of charge it receives. The voltage provides a measure of an amount of light incident on the pixel during the exposure period. Transfer of photocharge from the photodiode regions of the pixels in the photosensor to their storage regions and from the storage regions to the readout amplifier is accomplished by applying a sequence of voltages to the gate electrodes of the pixels. A set of voltages for all the pixels in the photosensor is referred to as a frame of the photosensor. The voltages in a frame may be used to display an image of the scene.

In an interline photosensor, alternate lines of pixels comprised in the photosensor may be independently controlled to collect and register light from a scene. In particular, odd and even columns of pixels may alternately be activated to receive and register light from a scene.

For example, in a gated time of flight (TOF) three dimensional (3D) camera that acquires distances to features in a scene, odd and even columns of pixels in an interline photosensor of the camera may be controlled to provide different measurements of light from the scene that are used to determine the distances. In such a camera a pulse train of short light pulses from a suitable, usually infrared (IR), light source is transmitted to illuminate the scene. Odd columns of pixels may be shuttered on, also referred to as "gated on" or "turned on", following each of a first subset of light pulses in the pulse train for a relatively short exposure period to register light that is reflected from the light pulse by features in the scene. Even columns of pixels may be shuttered on following each light pulse in a second subset of light pulses in the pulse train for a relatively long exposure period to register light that is reflected from the light pulse by features in the scene. Light registered during the short and long exposure periods is, conventionally, often referred to as "gated" and "ungated" light respectively.

Following a last light pulse in the light pulse train, pixels in the odd and even columns of pixels in the photosensor are read to provide a frame of voltages that represent amounts of gated and ungated light registered by the photosensor for each of the features in the scene that is imaged on the pixels. Voltage in the frame responsive to gated light from a feature may be normalized to voltage in the frame responsive to ungated light from the feature and the normalized voltage used to determine distance to the feature. Distances to the features provide a range image of the scene.

Generally, intensity of light in the pulse train of transmitted light pulses is limited and amounts of light that are reflected by features in a scene from the light pulses that are available for determining distances to the features are relatively small. As the amounts of light available for determining distances decreases, accuracies with which the distances may be determined decreases.

For a TOF 3D camera using an interline photosensor for which odd columns of pixels are used to measure gated light and even pixel columns are used to acquire measurements of ungated light only about half of the available light collecting area of the photosensor is used to collect and register light for each of the measurements. Whereas the TOF 3D camera provides advantages in acquiring measurements of gated and ungated light from a same light pulse train and in a same frame of the photosensor, using only about half of the light collecting area of the photosensor for each of the measurements may degrade accuracy with which distance measurements are provided by the camera

SUMMARY

An aspect of an embodiment of the invention relates to providing a method of controlling a photosensor to provide pixels in the photosensor with enlarged depletion zones and corresponding increased sensitivity for imaging light from a scene. To provide the enlarged depletion zones, voltage is applied to gate electrodes of pixels in the photosensor to alternately turn on pixels in odd and even rows of pixels to receive and register light from the scene. When pixels in odd or even rows are turned on, pixels in even and odd rows respectively are turned off so that they are substantially insensitive to light. Voltage applied to gate electrodes to turn on pixels in odd and even rows creates enlarged depletion zones in the turned on pixels that extend into photodiode regions of adjacent, turned off pixels, in even and odd rows respectively. The enlarged depletion zones provide enhanced light sensitivity for the turned on pixels.

In an embodiment of the invention, cross talk between turned on and turned off pixels is prevented by removing and storing photocharge generated in depletion zones of the turned on pixels substantially upon its generation.

An aspect of the invention relates to providing a time of flight 3D camera having an interline photosensor and a controller that controls pixels in the photosensor to acquire measurements of gated and ungated light with enlarged depletion zones.

In the discussion, unless otherwise stated, adverbs such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. A label labeling an icon representing a given feature of an embodiment of the invention in a figure may be used to reference the given feature. Dimensions of components and features shown in the figures are chosen for convenience and clarity of presentation and are not necessarily shown to scale.

DETAILED DESCRIPTION

The detailed description below describes a photosensor that is configured and operated in accordance with an embodiment of the invention to image a scene on pixels having enlarged depletion zones. By way of example, the photosensor is assumed to be a CCD interline photosensor. Details of the structure and operation of the interline photosensor in accordance with an embodiment of the invention to alternately image the scene on odd and even rows of pixels that are controlled to have enlarged depletion zones are described with reference to FIGS. 1A and 1B. A gated TOF 3D camera comprising an interline photosensor operated to acquire a range image for a scene with pixels having enlarged depletion zones is discussed with reference to FIGS. 2A and 2B.

Figure 1A:
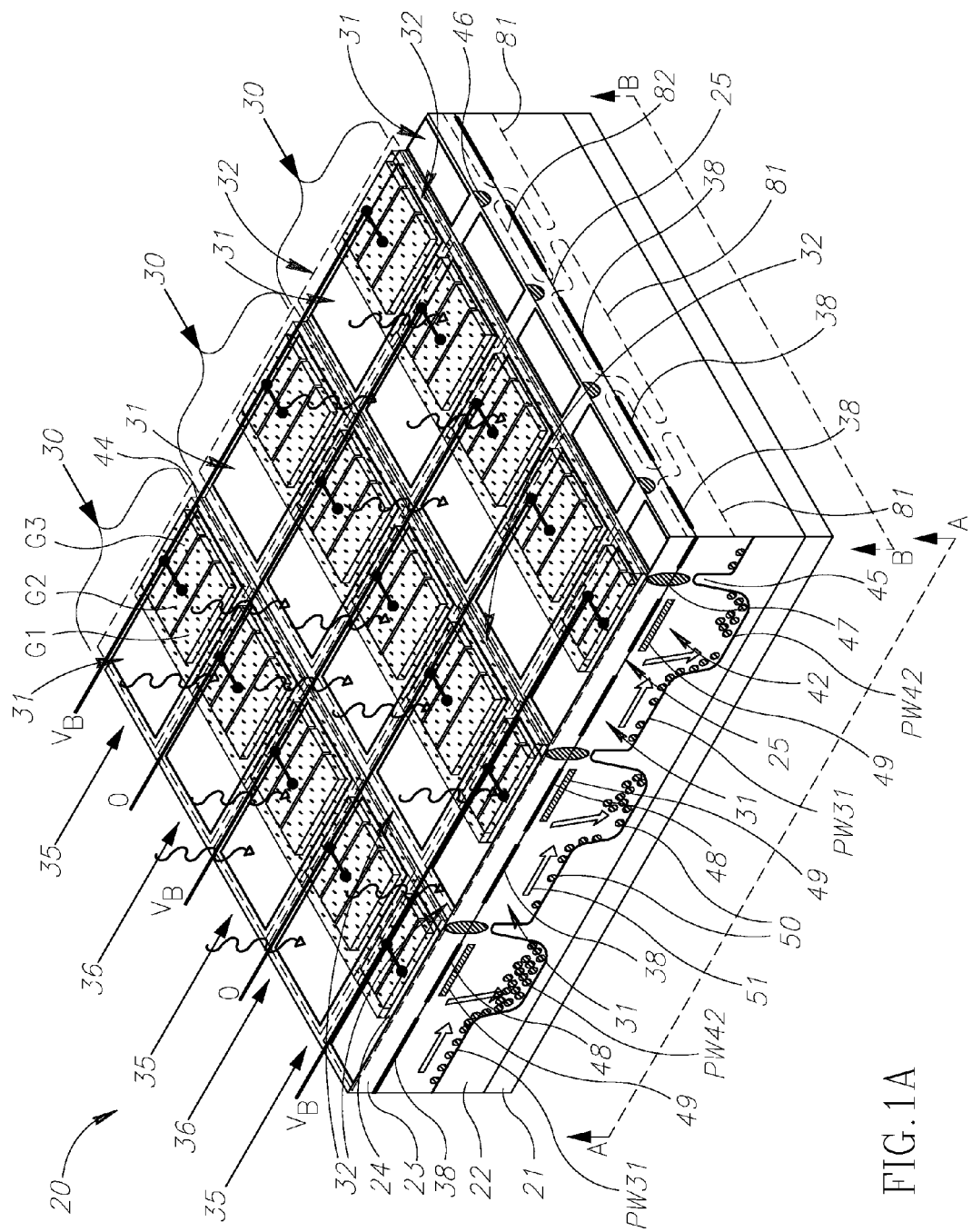
FIG. 1A schematically shows an interline photosensor imaging a scene on odd rows of pixels having enlarged depletion zones, in accordance with an embodiment of the invention.
Figure 1B:
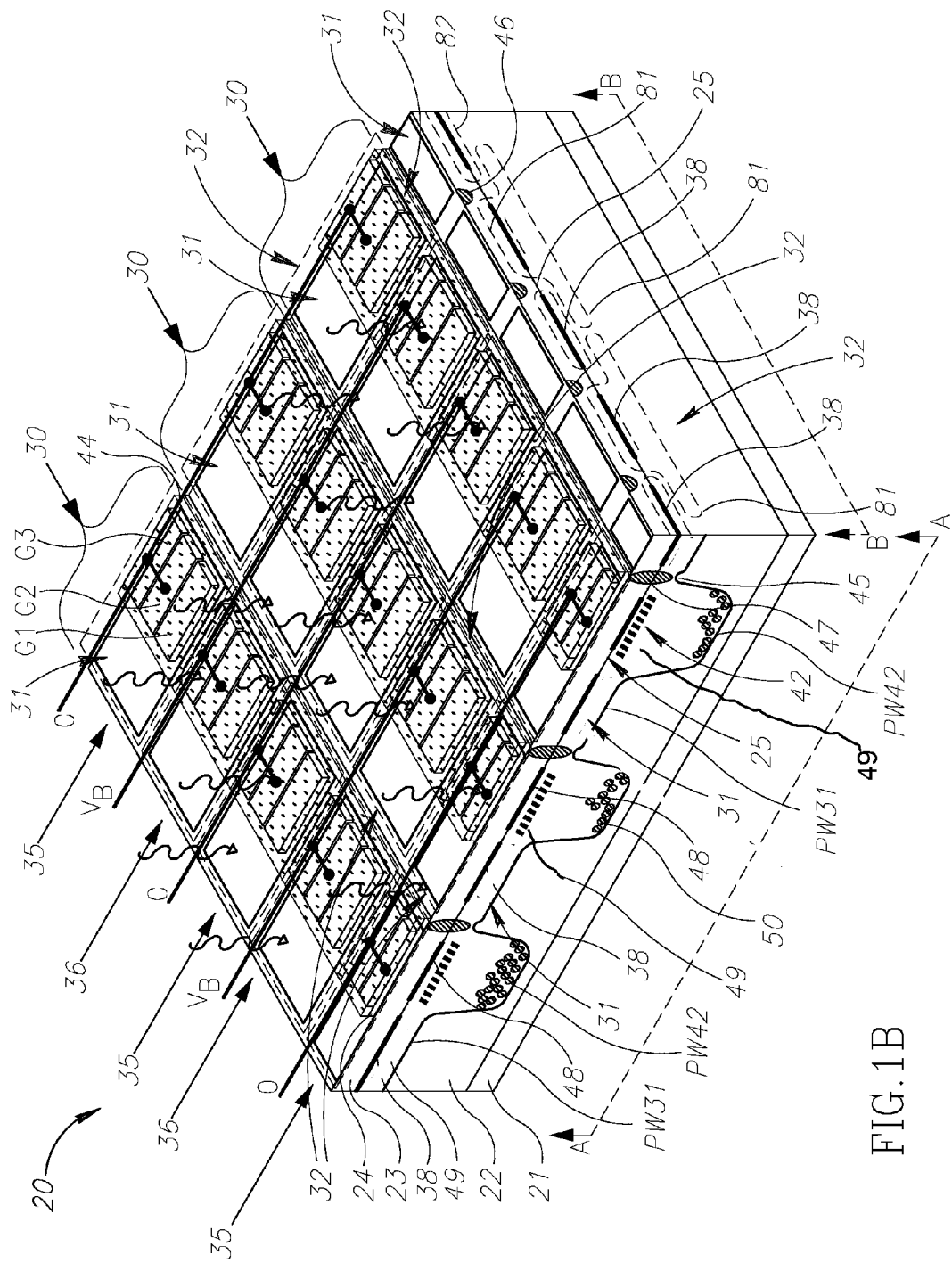
FIG. 1B schematically shows the interline photosensor shown in FIG. 1A imaging the scene on even rows of pixels having enlarged depletion zones, in accordance with an embodiment of the invention.

FIGS. 1A and 1B schematically show perspective views of a portion of a CCD interline photosensor 20 that is configured and controlled in accordance with an embodiment of the invention to alternately turn on pixels in odd and even rows of pixels in the photosensor so that they have enlarged depletion zones for imaging light from a scene (not shown). Photosensor 20 is shown highly simplified and cutaway to show two orthogonal cross sections, A-A and B-B, which expose internal structure of the photosensor. Light from the scene that is incident on the photosensor is schematically represented by wavy arrows 60.

Photosensor 20 comprises light sensitive pixels schematically indicated by dashed rectangles 32 configured in an array having odd and even rows 35 and 36 respectively of pixels 32 and columns 30 of pixels 32. Each pixel 32 comprises a photodiode region 31 and a storage region 42 on which gate electrodes G1, G2 and G3 are formed on a silicon dioxide insulating layer 24. Storage regions 42 may be overlaid with a "masking" layer 44 of material, optionally a metal, which is opaque to light 60 and substantially blocks exposure of storage regions 42 to light 60. Light 60 incident on storage regions 42 does not create photoelectrons in the storage regions because the light is blocked by masking layer 44.

Cross sections A-A and B-B are respectively perpendicular to and parallel to columns 30. Cross section B-B lies along a plane that bisects photodiode regions 31 of a column 30 of pixels 32. Cross section A-A lies along an odd row 35 of pixels 32, and bisects their gate electrodes G2.

Photosensor 20 is assumed configured to accumulate photoelectrons from electron-hole pairs generated by incident light 60 to measure amounts of light 60 incident on the photosensor. Photosensor 20 optionally comprises a silicon n-type doped substrate electrode 21, a p-type doped epitaxial layer 22, and an n-type doped layer 23 that contacts layer 22 along an interface 25. Layer 23 is covered under gate electrodes G1, G2, and G3 by silicon dioxide insulating layer 24. Photodiode regions 31 of pixels 32 comprise np junctions along interface 25 that are indicated by bold lines 38 in cross sections A-A and B-B. Storage regions 42 of the pixels have np junctions along interface 25 that are indicated by bold lines 48 in cross section A-A. It is noted that layer 23, which in FIGS. 1A and 1B is schematically shown as a continuous layer, is generally discontinuous and consists of n-type doped separate regions formed on or in epitaxial layer 22. Each region provides a different one of np junctions 48 and 38.

Photodiode regions 31 of pixels 32 in a column 30 of pixels are electrically isolated by channel stops 47 from storage regions 42 of pixels in an adjacent column 30 of pixels. Photodiode regions 31 of pixels in adjacent odd and even rows 35 and 36 of pixels 32 are electrically isolated from each other by channel stops 46. In an embodiment of the invention channel stops 46 are relatively small to facilitate accumulation of photocharge from enlarged depletion zones as discussed below. Channel stops 49 shown in cross section A-A operate to isolate np junctions 48 from substrate electrode 21 and prevent leakage current between storage regions 42 and the substrate electrode.

In FIG. 1A light 60 from the scene that is incident on photosensor 20 is imaged on pixels 32 in odd pixel rows 35. In an embodiment of the invention, a positive bias voltage $V_B$ relative to a reference ground, nominally zero voltage, of epitaxial layer 22, is applied to gate electrodes G2 and G3 of each pixel 32 in odd rows 35 of pixels to back bias np junctions 48 of pixels 32 in the odd rows. Back bias voltage $V_B$ turns on the odd row pixels 32, and makes them sensitive to light 60. Electrodes G2 and G3 of pixels 32 in even rows 36 of pixels are electrified to zero voltage relative to substrate electrode 21 to turn off the pixels in the even rows and make them relatively insensitive to light 60. Application of voltage $V_B$ to pixels 32 in odd pixel rows 35 is schematically indicated by bold lines labeled "$V_B$" that are connected to gate electrodes G2 and G3 of pixels 32 in odd pixel rows 35. Similarly, application of a zero voltage to pixels 32 in even pixel rows 36 relative to layer 22 is schematically indicated by bold lines labeled "0" that are connected to gate electrodes G2 and G3 of pixels 32 in even pixel rows 36. Gate electrodes G1 are set to a negative voltage to prevent cross talk between adjacent storage regions 42 of adjacent pixels 32.

Turned off pixels 32 in even pixel rows 36 have relatively small, "degenerate", depletion zones in their respective photodiode regions 31. Photodiode regions for pixels 31 that are shown in cross section B-B are schematically indicated by dashed borders 82 in cross section B-B. Degenerate depletion zones 82 have dimensions determined substantially by doping concentrations of p-type layer 22 and n-type layer 23.

In accordance with an embodiment of the invention, voltage $V_B$ applied to gate electrodes G2 and G3 to back bias and turn on pixels 32 in odd pixel rows 35 is sufficiently large to generate enlarged depletion zones at respective np junctions 48 (cross section A-A) in storage regions 42 of the turned on pixels. The enlarged depletion zone in a given pixel 32 extends from its np junction 48 in the pixel's storage region 42 not only to the pixel's own photodiode region 31 but also to photodiode regions 31 of adjacent pixels. In the adjacent pixel photodiode regions the enlarged depletion zone lies under the degenerate depletion zones 82 of the adjacent pixels. Enlarged depletion zones of turned on pixels 32 shown in cross section B-B are schematically represented by dashed borders 81 in the cross section and are shown underlying degenerate depletion regions 81 in photodiode regions 31 of turned off adjacent pixels 32 in even pixel rows 36.

The enlarged depletion regions 81 create relatively large and deep potential wells for photoelectrons generated in turned on pixels 32 and in portions of the enlarged depletion zones located below depletion zones 82 of adjacent turned off pixels. Potential wells provided by enlarged depletion zones 81 for turned on pixels 32 shown in cross section A-A are schematically indicated by line segments PW42 in the cross section. Depth of a potential well PW42 is schematically indicated by location of line segment PW42 below interface 25 in cross section A-A. Depth of a potential well PW31 in photodiode region 31 of each turned on pixel 32 is less than depth of potential well PW42 in the pixel.

As a result of the depth of potential well PW42, photoelectrons formed in photodiode region 31 of a given turned on pixel 32 in an odd pixel row 35 are swept from potential well PW31 in the photodiode region into and stored in the pixel's potential well PW42 substantially upon their generation in the photodiode region. Cross section A-A schematically shows photoelectrons represented by shaded circles 50 generated by light 60 drifting from potential wells PW31 of pixels shown in the cross section into their respective potential wells PW42. Direction of drift of the photoelectrons 50 is schematically indicated by block arrows 51. It is noted that channel stops 47 generate potential barriers 45 that operate to prevent photoelectrons produced in a photodiode region 31 of a given turned on pixel 32 from drifting the "wrong way" towards a storage potential well PW42 of an adjacent pixel 32.

Potential well PW42 of a given turned on pixel 32 in an odd pixel row 35 also attracts photoelectrons generated in portions of enlarged depletion zone 81 of the given pixel 32 that extend into adjacent turned off pixels. Therefore, a turned on pixel 32, in accordance with an embodiment of the invention, accumulates photoelectrons during an exposure period from an enlarged depletion zone 81 that is advantageously larger than a typical depletion zone limited in extent to a single pixel.

In an embodiment of the invention for a same pixel size, fill factor, and exposure to light, an enlarged depletion zone in accordance with an embodiment may provide a turned on pixel 32 with an effective depletion zone for generating photocharge that is equal to or greater than about 1.5 times that of a typical depletion zone. Optionally, the effective depletion zone is equal to about twice that of a typical depletion zone.

It is noted that the relatively small channel stops 46, in accordance with an embodiment of the invention, facilitate drift of photoelectrons to a potential well PW42 of a turned on pixel 32 from portions of its enlarge depletion zone in adjacent pixels. The negative voltage noted above applied to gate electrodes G1 during an exposure period of photosensor 20 operates to prevent the relatively deep potential well PW42 of a turned on pixel from "stealing" photocharge accumulated in a storage region 42 of an adjacent turned off pixel, as noted below.

In an embodiment of the invention, following imaging of light 60 on odd pixel rows 35, photosensor 35 is controlled to image light 60 on even pixel rows 36. Pixels 32 in odd pixel rows 35 are turned off by setting voltage on their respective gate electrodes G2 and G3 to ground voltage zero of layer 22 and pixels 32 in even pixel rows 36 are turned on for an exposure period to light 60 by applying voltage $V_B$ to their respective gate electrodes G2 and G3.

FIG. 1B schematically shows odd pixel rows 35 turned off and even pixel rows 36 turned on and photosensor imaging light 60 on pixels 32 in even pixel rows 36. Enlarged depletion zones 81 shown in cross section B-B in FIG. 1B are now located in pixels 32 in even pixel rows 36 rather than in pixels 32 of odd pixel rows 35 as shown in FIG. 1A. And degenerate depletion zones 82 which were located in pixels 32 of even pixel rows 36 in FIG. 1A are located in pixels 32 in odd pixel rows 35 in FIG. 1B.

Because voltage applied to gate electrodes G2 and G3 for turned off pixels 35 in odd pixel rows 35 is substantially equal to zero (relative to voltage of epitaxial layer 22) and their respective depletion zones have become degenerate, potential wells PW42 in turned off pixels 32 in the odd pixel rows have decreased in depth, and potential wells PW31 have become relatively shallow or substantially nonexistent. Potential wells PW42 shown in cross section A-A in FIG. 1B for turned off pixels 32 in odd pixel rows 35 shown in cross section A-A are shown closer to line 25 than in FIG. 1A to indicate that the potential wells are relatively shallow. And photoelectrons 50 shown in potential wells PW31 in FIG. 1A are absent from potential well PW31 in turned off pixels 32 shown in cross section A-A in FIG. 1B. The absence of photocharge indicates that little if any photocharge is produced by light 60 in degenerate depletion zones of turned off pixels 32 in the odd pixel rows 35 during the exposure period of pixels 32 in even pixel rows 36.

It is noted that whereas in FIG. 1B (cross section A-A) photoelectrons 50 are absent from potential wells PW31 for pixels 32 in odd pixel rows 35, photoelectrons 50 that were accumulated in storage regions 42 during the exposure period of pixels 32 in odd pixel rows 35 when they were turned on (FIG. 1A) remain stored in the storage regions. During the exposure period of even pixel rows 36, negative voltage applied to gate electrodes G1 prevent photoelectrons accumulated in the even row pixels from leaking to the relatively deep potential wells PW42 of the turned on pixels. Therefore photoelectrons remain stored in storage regions 42 of odd pixel rows 35 until storage regions 42 of all pixels 32 are read, and a frame of photosensor 20 acquired as described below.

Following imaging of light 60 by pixels in odd and even rows 35 and 36, photoelectrons accumulated in storage regions 42 in each column 40 are moved to a readout amplifier (not shown). Transfer of photoelectrons to the readout amplifier may be accomplished by applying an appropriate sequence of transfer voltages to gate electrodes G1, G2 and G3 in each column 30 that move the photocharges from one to the other of the storage regions in the column so that the photoelectrons in each storage pixel in column 30 in turn is input to the readout amplifier. The readout amplifier converts charge carried by the transferred photoelectrons it receives from each storage region 42 to a voltage signal, to provide a frame of photosensor 20 which may be used to provide an image of the scene from which light 60 reached photosensor 20.

Because, in accordance with an embodiment of the invention, photoelectrons are generated in enlarged depletions regions 81 of pixels 32 in photosensor 20, photosensor 20 acquires a greater number of photoelectrons for each pixel responsive to light 60 than might otherwise be acquired conventionally. As a result, photosensor may provide measurements of intensity of light 60 characterized by enhanced accuracy and images of the scene imaged with light 60 characterized by enhanced fidelity.

Following acquisition of a frame of photosensor 20, the photosensor may be reset to acquire another image by resetting pixels 32. Pixels 32 may be reset and residual photoelectrons that may have accumulated in pixels 32 prior to using photosensor 20 to acquire another image removed by applying a reset voltage $V_R$ to substrate electrode 21 that produces an electric field in photosensor 20 that drains photoelectrons from the pixels to the substrate. Following resetting of pixels 32, resetting voltage of substrate electrode 21 to an operating voltage, $V_o$, at which pixels 32 in odd or even rows of pixels may be turned on to accumulate photocharge generated by incident light prepares photosensor 20 for acquiring an image.

Whereas controlling voltage of substrate electrode 21 may be used to reset and prepare photosensor 20 to acquire a new image, the photosensor may be shuttered, or "gated", on and off, optionally at high frequencies, in accordance with an embodiment of the invention by controlling voltage of the substrate electrode relative to voltage of the pixels. For example, assume that odd rows 35 of pixels 32 are turned on by applying voltage $V_B$ to their respective gate electrodes G1 and G2. The odd row pixels may be turned off and subsequently turned back on, optionally without changing $V_B$ applied to gate electrodes G2 and G3 by respectively setting voltage of substrate electrode 21 to $V_R$ and $V_o$.

By way of a numerical example, in an embodiment of the invention, substrate electrode 21 is optionally formed from silicon (Si) and may have a thickness greater than about 50 μm (micrometers) and a n-type doping having a concentration of phosphorus atoms equal to about $10^{16}/cm^3$. Epitaxial layer 21 is optionally a p-type Si layer having thickness equal to about 4 μm and may be doped with phosphorus (P) at a concentration of about $10^{14}/cm^3$. N-type layer 23 may have thickness equal to about 0.5 μm in photodiode regions 31 of and about 0.1 μm in regions of storage regions 42. In the photodiode regions 31, layer 23 may have a dopant concentration of P equal to about $10^{16}$ and in storage regions 42 equal to about $10^{17}$. Channel stops 47 may be formed by Boron doping at a concentration of between about $10^{16}/cm^3$-$10^{18}/cm^3$. Channel stops 46 located between adjacent photodiode regions 31 may be relatively small. In an embodiment of the invention, the channel stops extend to a depth less than about 1 μm from a top surface of n-type layer 23. Optionally, channel stop 46 descend to a depth equal to about 0.5 μm and has a concentration of p-type dopant atoms equal to about $10^{18}/cm^3$. Channel stops 49 in storage regions 42 may have a thickness equal to about 1 μm and p-type dopants concentration equal to about $10^{16}/cm^3$.

In operation, during accumulating photocharge generated by light 60, an operating voltage $V_o$ equal to about 8 volts may be applied to substrate electrode 21 relative to a reference ground voltage of epitaxial layer 22. $V_B$ applied to gate electrodes G2 and G3 may have a magnitude equal to about 12 volts. Voltage of substrate electrode 21 may be raised to a reset voltage $V_R$ equal to about 30 volts to reset or gate off photo sensor 20.

A photosensor similar to photosensor 20 operated to have enlarged depletion zones and shuttered by controlling voltage to a substrate of the photosensor may be used in accordance with an embodiment of the invention to provide a gated TOF 3D camera.

Figure 2A:
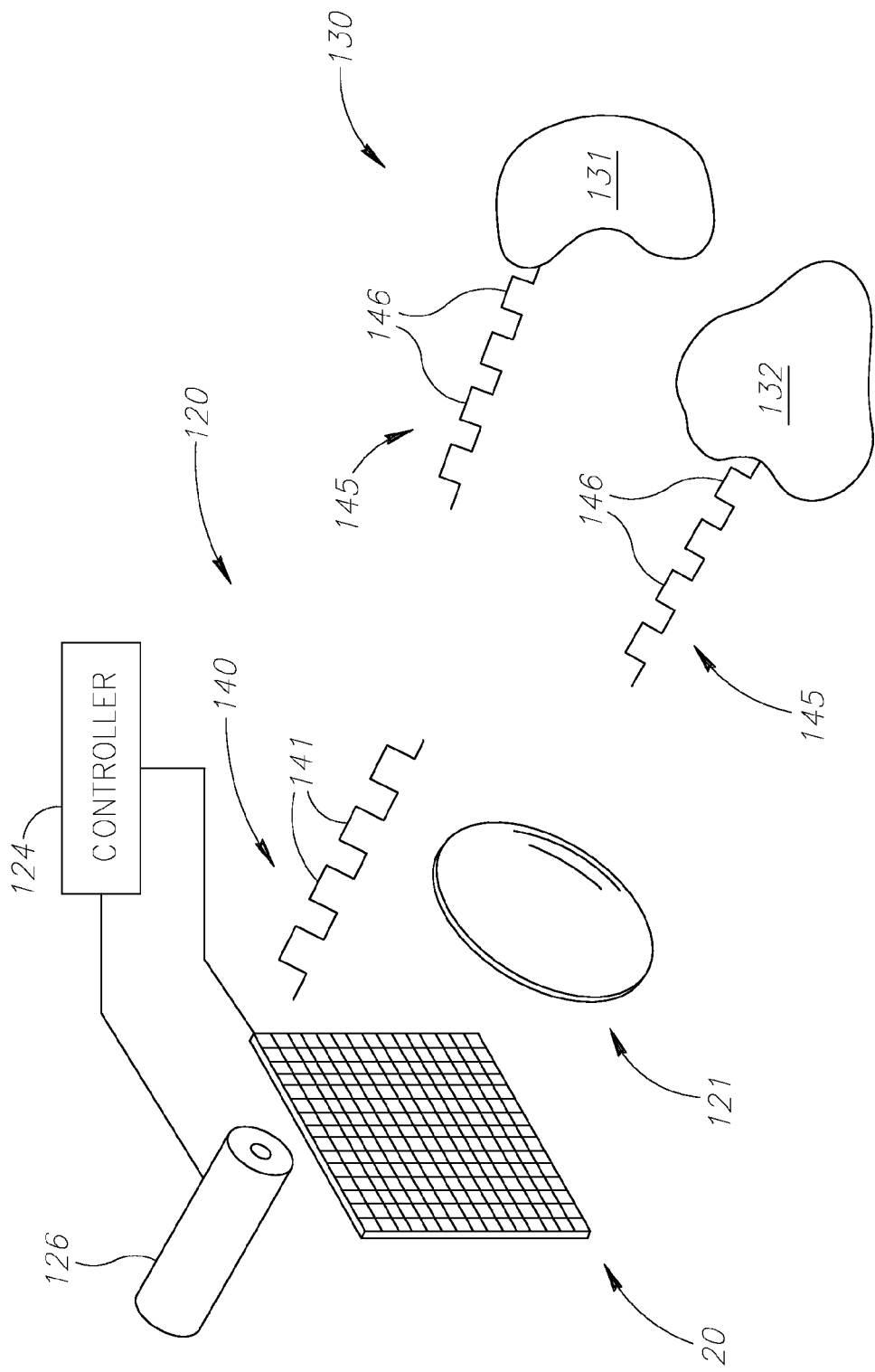
FIG. 2A schematically shows a gated 3D camera comprising the interline photosurface, shown in FIGS. 1A and 1B imaging a scene to determine distance to features in the scene, in accordance with an embodiment of the invention.

FIG. 2A schematically shows a gated 3D camera 120 comprising an interline photosensor, such as photosensor 20, that is controlled in accordance with an embodiment of the invention to image a scene 130 on pixels having enlarged depletion zones 81 to determine distances to features of the scene. Optionally, the camera is shuttered on and off, "gated on and off", by controlling voltage to a substrate electrode 21 of the photosensor. Scene 130 is schematically shown having objects 131 and 132.

Camera 120, which is represented very schematically, comprises a lens system, represented by a lens 121, and interline photosensor 20 on which the lens system images the scene. Camera 120 optionally comprises a light source 126, such as for example, a laser or a LED, or an array of lasers and/or LEDs, controllable to illuminate scene 130 with pulses of light. A controller 124 controls pulsing of light source 126 and gating of pixels 32 in odd and even pixel rows 35 and 36 (FIGS. 1A and 1B) in photosensor 20. Gating of pixels 32 in an odd and even pixel row 35 and 36 may be referred to as gating the odd and even pixel row.

To provide a 3D range image of scene 130, controller 124 optionally controls 3D camera 120 first to image scene 130 optionally on odd pixel rows 35 to acquire gated light for the scene and then to image the scene on even pixel rows 36 to acquire ungated light for the scene. Gated and ungated light are acquired by gating on and off pixels 32 in odd and even pixel rows 35 and 36 for relatively short and long exposure periods respectively at times responsive to timing of light pulses emitted by light source 126 to illuminate scene 130. Timing of light pulses and gating of photosensor 20 to acquire gated light are schematically illustrated along time lines 210, 220, 230, 240 in a time line graph 200 shown in FIG. 2B. All the time lines have a same, arbitrary, time scale. Details of the acquisition of gated and ungated light and timeline graph 200 are discussed below.

To acquire gated light, controller 124 optionally applies a negative voltage to gate electrodes G1, and a voltage $V_B$ to gate electrodes G2 and G3 comprised in pixels 32 in odd pixel rows 35 to turn on the pixels and provide them with enlarged depletion zones. The controller applies a zero voltage to gate electrodes G2 and G3 to turn off pixels 32 in even pixels rows 36. The controller applies a voltage $V_{Off}$ optionally equal to reset voltage $V_R$ to substrate electrode 21 so that photosensor 20 is normally gated off and insensitive to light, and controls light source 126 to illuminate scene 130 with a train of light pulses. The train of light pulses is schematically represented in FIG. 2A by a train 140 of square "light" pulses 141 having pulse widths, τ. A number of light pulses 141 from light pulse train 140 are schematically shown along time line 210 in timeline graph 200. Light pulses 141 along time line 210 are shown with pulse width τ and an overhead arrow 211 pointing from left to right to indicate that the light pulses are emitted from light source 126 towards scene 130.

Following an accurately predetermined delay time, T, after a time of emission of each light pulse 141, controller 124 gates on photosensor 20 for a short exposure period to image light reflected by features in scene 130 from the emitted light pulse on pixels 32 in odd pixel rows 35. Controller 124 gates on photosensor 20 by lowering voltage applied to substrate electrode 21 from a voltage $V_{Off}$ to a voltage $V_{On}$ optionally equal to operating voltage $V_o$ for a duration of the exposure period. Optionally, the exposure periods have a duration equal to light pulse width τ.

Figure 2B:
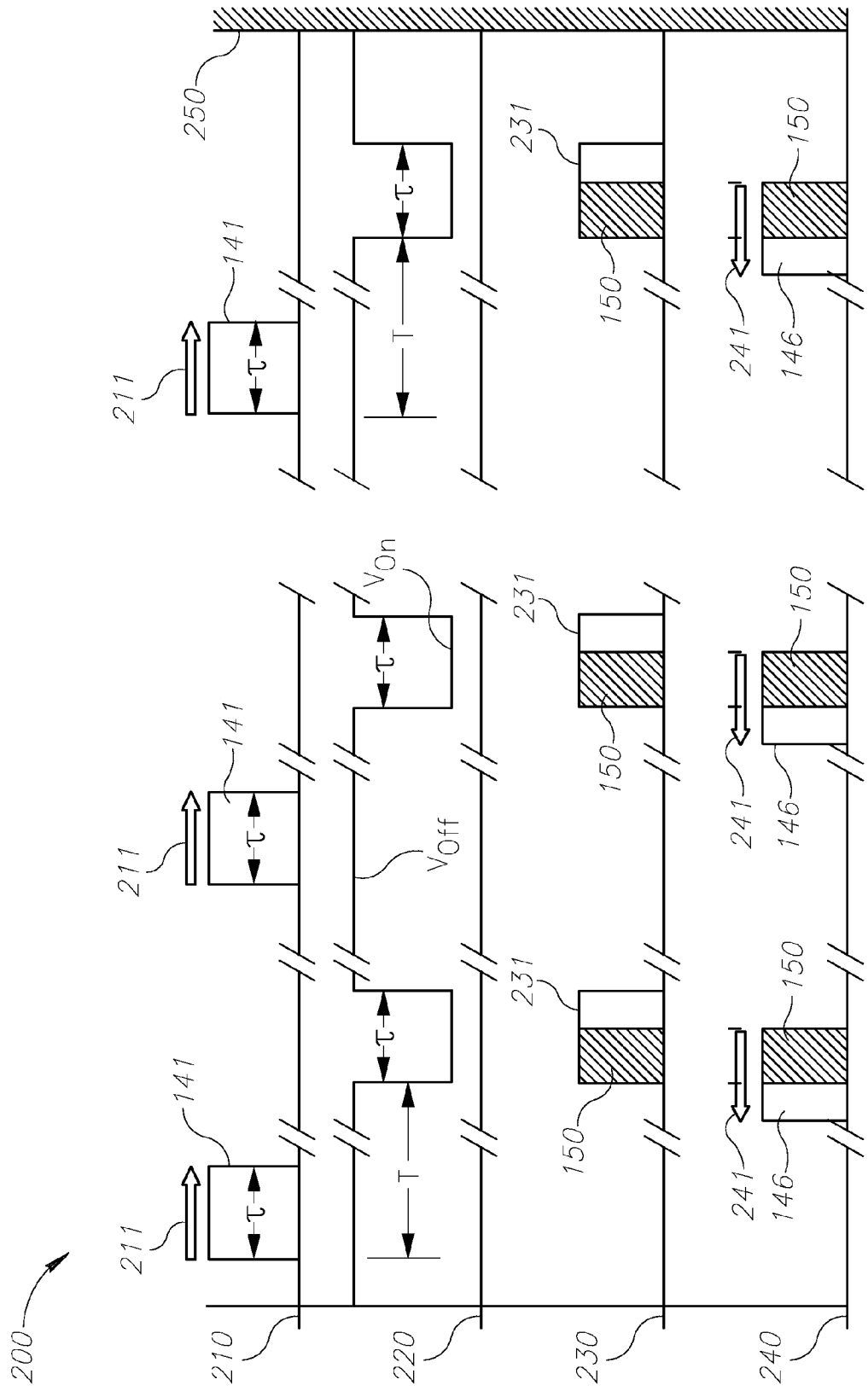
FIG. 2B shows a time line graph illustrating gating of the gated 3D camera shown in FIG. 2A, in accordance with an embodiment of the invention.

Timing of voltage $V_{On}$ applied to substrate electrode 21 to gate on photosensor 20 relative to timing of emission of light pulses 141 is schematically shown along time line 220 in FIG. 2B. Voltage $V_{Off}$ is represented by height of a line labeled $V_{Off}$ above time line 220 and voltage $V_{On}$ is represented by height of lines labeled $V_{On}$ above time line 220. Voltages $V_{Off}$, $V_{On}$, time delay T, and gate width τ are shown along the time line. The resulting short exposure periods of photosensor 20, optionally of duration τ, are schematically indicated by hat functions 231 along time line 230.

It is noted that the light pulse width, gate width and delay time T define a spatial "imaging slice" of scene 130 between a minimum, lower bound, distance, $D_L$, and a maximum, upper bound distance, $D_U$, from camera 120. The camera registers light reflected from the scene during gates 231 only for features of the scene located between distance $D_L$ and $D_U$. By way of example, for equal light pulse and gate widths τ and delay T, $D_L = c(T-\tau)/2$, $D_U = c(T+\tau)/2$ and the imaging slice has a thickness cτ, where c is the speed of light.

Light from each light pulse 141 reflected by features in scene 130 located in the imaging slice is incident on camera 120, collected by lens 121 and imaged on pixels 32 in odd pixel rows 35 of photosensor 20. Light reflected from light pulses 141 by features in scene 130 are schematically represented by trains 145 of light pulses 146 in FIG. 2A for two regions of scene 130. Light pulses 146 from a light pulse train 145 reflected by a particular region of scene 130 imaged on a corresponding pixel 32 in photosensor 20 are schematically shown along time line 240 of time line graph 200 in FIG. 2B. Light pulses 146 in graph 200 are shown with overhead arrows 241 pointing right to left to indicate that the light pulses are reflected light pulses propagating from scene 130 back to gated 3D camera 120.

Amounts of light from reflected pulse trains 145 imaged on turned on pixels 32 in odd pixel rows 35 during short exposure periods 231 generate photoelectrons, which are stored in storage regions 42 of the pixels. An amount of photoelectrons generated and stored responsive to a given reflected light pulse 146 during a short exposure period 231 is substantially proportional to a temporal overlap of the given light pulse 146 with exposure period 231. Temporal overlap of reflected light pulses 146 and short exposure periods 231 are indicated by shaded regions 150 in light pulses 146 and gates 231. An amount of electric charge associated with photoelectrons stored in a storage region 42 of given pixel 32 in an odd pixel row 35 responsive to reflected light pulses 146 in a light pulse train 145 provides a measure of gated light for a feature in the imaging slice of scene 130 imaged on the pixel 32. Following a last transmitted light pulse 141 (FIG. 2A) for which photosensor 20 is gated on by controller 124 for short exposure periods 231 (FIG. 2B), photosensor 20 has acquired quantities of photoelectrons in storage regions 42 in odd pixel rows 35 that provide measures of gated light for features in scene 130.

After acquiring gated light for scene 130, controller 124 optionally controls camera 120 to image scene 130 on even pixel rows 36 to acquire ungated light for scene 130. To acquire ungated light, controller 124 applies a zero voltage optionally to gate electrodes G2 and G3 of pixels 32 in odd pixel rows 35 to turn off the pixels in the odd rows, applies a voltage $V_B$ to turn on pixels 32 in even pixels rows 36 and provide them with enlarged depletion zones. Controller 124 then controls camera 120 to repeat the process described above for acquiring gated light but with gating photosensor 20 on for relatively long exposure periods after transmission of a light pulse 141 by light source 126 to illuminate scene 130.

In an embodiment of the invention, after controlling camera 120 to accumulate photoelectrons in pixels 32 in odd pixel rows 35 that provide a measure of gated light for scene 130 and in pixels 32 in even pixel rows 36 that provide a measure of ungated light for the scene, controller 124 controls photosensor 20 to acquire a frame of the photosensor. Optionally, the controller processes voltages in the frame representing gated and ungated light to provide distances to features in scene 130. The provided distances, which are determined in accordance with an embodiment of the invention responsive to photoelectrons produced in pixels having enlarged depletion zones may be characterized by relatively enhanced accuracy.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:
1. A photosensor comprising:
   first and second adjacent light sensitive pixels, each comprising:
      a photodiode region that includes an np junction having a depletion zone in which photocharge carriers are generated responsive to incident light;
      a storage region configured to accumulate and store photocharge carriers generated in the photodiode region, the storage region including an np junction having a depletion zone;

and at least one gate electrode to which voltage may be applied to control the storage region depletion zone; and a controller operable to configure voltage of the at least one gate electrode of the first pixel to enlarge the depletion zone of the storage region in the first pixel so that it extends into the photodiode region of the second pixel and generates electric fields that cause photocharge generated in the photodiode region of the second pixel to drift to and be stored in the storage region of the second pixel.

2. A photosensor according to claim 1 wherein the controller is operable to configure voltage to the at least one gate electrode of the second pixel so that the depletion zone associated with the np junction in the photodiode region of the second pixel is relatively small.

3. A photosensor according to claim 2 wherein the relatively small depletion zone is limited in spatial extent substantially by a doping concentration of the np junction in the photodiode region of the second pixel.

4. A photosensor according to claim 3 wherein a portion of the enlarged depletion zone of the first pixel that extends into the photodiode region of the second pixel is located under the relatively small depletion zone in the photodiode region of the second pixel.

5. A photosensor according to claim 1 wherein a relatively small channel barrier is located between the photodiode regions of the first and second pixels.

6. A photosensor according to claim 1 wherein the at least one gate electrode comprises a plurality of gate electrodes.

7. A photosensor according to claim 6 wherein the controller is operable to apply a voltage to a gate electrode of the plurality of gate electrodes of the first pixel to prevent photocharge carriers drifting from the storage region of the second pixel to the storage region of the first pixel.

8. A photosensor according to claim 1 wherein subsequent to configuring voltage of the at least one gate electrode of the first pixel to provide the enlarged depletion zone for the first pixel, the controller is operable to configure voltage to the at least one gate electrode of the second pixel so that the depletion zone of the storage region in the second pixel extends into the photodiode region of the first pixel.

9. A photosensor according to claim 1 and comprising a substrate electrode over which the first and second pixels lie.

10. A photosensor according to claim 9 wherein the controller is operable to control voltage applied to the substrate electrode to gate the first pixel off and on.

11. A photosensor according to claim 10 wherein the controller is operable to gate the first pixel off and on while maintaining a configuration of voltage on the at least one electrode of the first pixel that operates to provide the first pixel with the enlarged depletion zone.

12. A photosensor according to claim 1 and comprising an array of rows and columns of first and second adjacent pixels and wherein the controller is operable to substantially simultaneously control the at least one gate electrode of each of the first pixels to provide it with an enlarged depletion zone that extends into the photodiode region of an adjacent second pixel.

13. A 3D time of flight camera operable to determine distances to features in a scene, the camera comprising:

a light source controllable to emit a pulse of light to illuminate the scene; and a photosensor according to claim 10 wherein the controller is configured to control voltage to the substrate electrode to gate the first pixel normally off and is configured to gate the first pixel on for an exposure period to receive and register light reflected from the light pulse by a feature in the scene at a time responsive to a time at which the light pulse is emitted so that photocharge generated in the enlarged depletion zone by the reflected light during the exposure period drifts to and is stored in the storage region of the first pixel.

14. A 3D time of flight camera according to claim 13 wherein the controller is configured to control the exposure period to be relatively short so that the stored photocharge provides a measure of gated light for the feature.

15. A 3D time of flight camera according to claim 13 wherein the controller is configured to control the exposure period to be relatively long so that the stored photocharge provides a measure of ungated light for the feature.

16. A method of controlling a photosensor comprising first and second adjacent light sensitive pixels each having a photodiode region for generating photocharge, a storage region for storing photocharge, and at least one gate electrode for controlling operation of the pixel, the method comprising configuring voltages to the at least one gate electrode of the first and second pixels so that first one and then the other accumulates photocharge carriers in its storage region generated in the photodiode regions of both pixels.

* * * * *